(12) United States Patent
Danmayr et al.

(10) Patent No.: US 9,494,659 B2
(45) Date of Patent: Nov. 15, 2016

(54) METHOD FOR CHECKING A SEPARATION POINT OF A PHOTOVOLTAIC INVERTER, AND PHOTOVOLTAIC INVERTER

(71) Applicant: Fronius International GmbH, Pettenbach (AT)

(72) Inventors: Joachim Danmayr, Nussbach (AT); Stefan Bloechl, Schoefweg (DE)

(73) Assignee: Fronius International GmbH, Pettenbach (AT)

( * ) Notice: Subject to any disclaimer, the term of this patent is extended or adjusted under 35 U.S.C. 154(b) by 138 days.

(21) Appl. No.: 14/395,184

(22) PCT Filed: Jun. 11, 2013

(86) PCT No.: PCT/AT2013/050118
§ 371 (c)(1),
(2) Date: Oct. 17, 2014

(87) PCT Pub. No.: WO2013/185160
PCT Pub. Date: Dec. 19, 2013

(65) Prior Publication Data
US 2015/0091604 A1    Apr. 2, 2015

(30) Foreign Application Priority Data
Jun. 13, 2012   (AT) .............. A 50232/2012

(51) Int. Cl.
*G01R 31/40*    (2014.01)
*H01H 47/00*    (2006.01)
(Continued)

(52) U.S. Cl.
CPC ............ *G01R 31/40* (2013.01); *H01H 47/002* (2013.01); *H02S 50/00* (2013.01); *H02S 50/10* (2014.12); *G01R 31/327* (2013.01); *G01R 31/42* (2013.01)

(58) Field of Classification Search
CPC .............. G01R 31/40; G01R 31/31721; G01R 31/42
(Continued)

(56) References Cited

U.S. PATENT DOCUMENTS 8,023,297 B2 * 9/2011 de Rooij ........... H02M 7/53873
363/132
8,779,630 B2   7/2014 Prior et al.
(Continued)

FOREIGN PATENT DOCUMENTS

DE   10 2009 047 980 A1   4/2011
DE   20 2009 018199 U1    6/2011
(Continued)

OTHER PUBLICATIONS

DIN EN 50 107, VDE 0128, Mar. 1993, pp. 1-32.
(Continued)

*Primary Examiner* — Tung X Nguyen
*Assistant Examiner* — Dominic Hawkins
(74) *Attorney, Agent, or Firm* — Collard & Roe, P.C.

(57) ABSTRACT

The invention relates to a method for checking a photovoltaic inverter separator (14) between the photovoltaic inverter (1) and a power supply network (7), comprising multiple phases (L1, L2, L3) and a neutral conductor (N), wherein multiple switching contacts of the separator (14) are controlled by the photovoltaic inverter (1), and the invention also relates to a photovoltaic inverter (1). The aim of the invention is to allow a simple and quick check of the functionality of the separator (14). This is achieved in that the switching contacts of the separator (14) are connected and checked in steps according to a switching pattern. In each step, each voltage (30, 31, 32 and 33, 34, 35) is measured at at least one phase (L1, L2, L3) upstream and downstream of the separator (14) in relation to the neutral (Continued)

Figure 1:
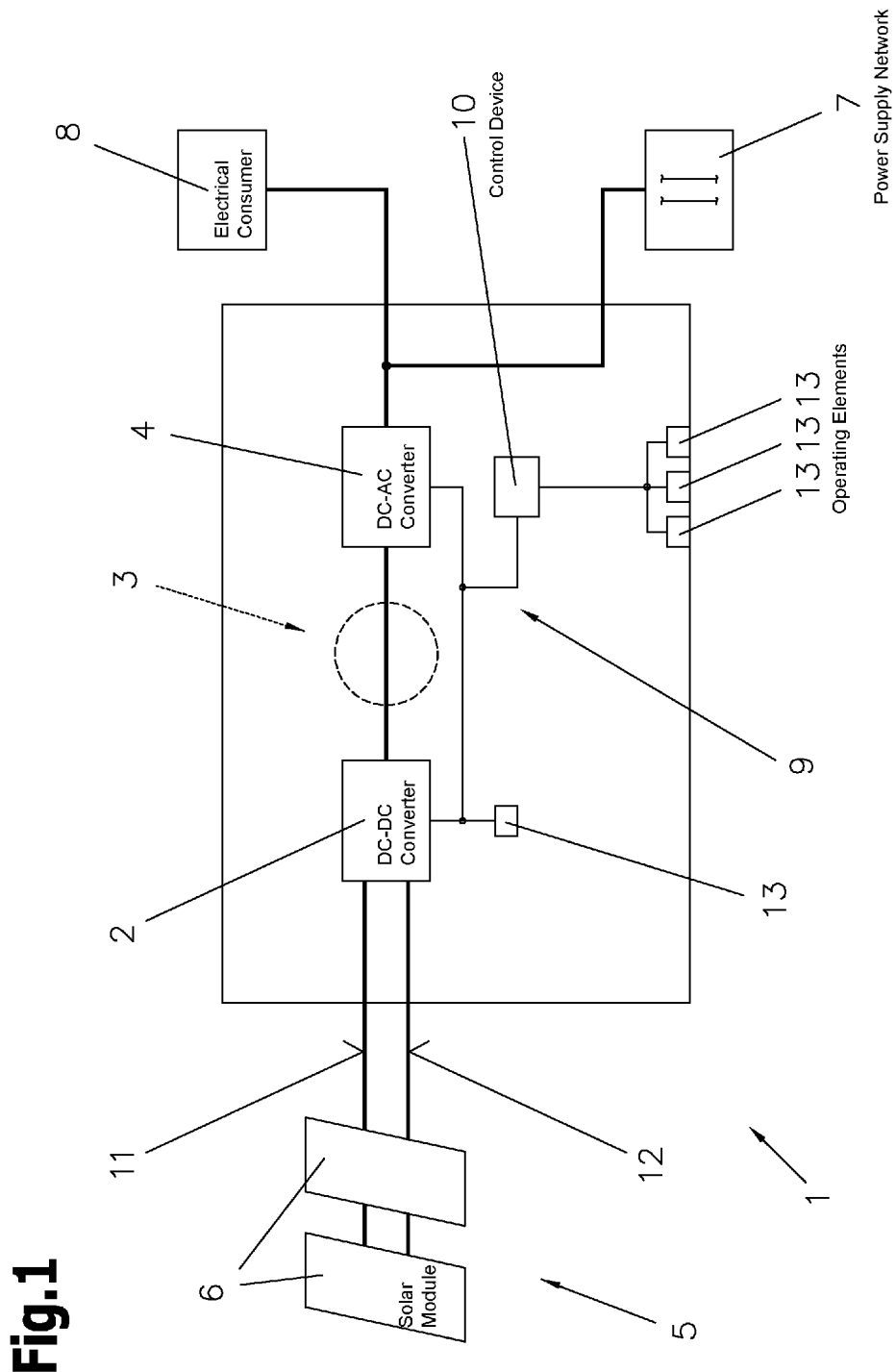

conductor (N), and the voltages are compared to one another.

6 Claims, 5 Drawing Sheets

(51) Int. Cl.
*H02S 50/10* (2014.01)
*G01R 31/327* (2006.01)
*G01R 31/42* (2006.01)

(58) Field of Classification Search
USPC .................................. 324/764.01, 537, 323
See application file for complete search history.

(56) References Cited

U.S. PATENT DOCUMENTS

| | | | | |
|---|---|---|---|---|
| 2005/0002214 A1* | 1/2005 | Deng | ................ | G05F 1/67 363/131 |
| 2009/0303763 A1* | 12/2009 | Yuguchi | ................ | H02J 7/35 363/79 |
| 2010/0226160 A1* | 9/2010 | Prior | ................ | H01H 47/002 363/132 |
| 2010/0237704 A1* | 9/2010 | Nakajima | ................ | H02M 5/14 307/83 |
| 2011/0031813 A1* | 2/2011 | Falk | ................ | H02J 3/383 307/77 |
| 2011/0083733 A1* | 4/2011 | Marroquin | ................ | H05K 7/10 136/256 |
| 2011/0210612 A1* | 9/2011 | Leutwein | ................ | H02J 3/383 307/80 |
| 2011/0249475 A1 | 10/2011 | Fujii et al. | | |
| 2011/0255316 A1* | 10/2011 | Burger | ................ | H02J 3/32 363/98 |
| 2011/0298470 A1 | 12/2011 | Gokhale et al. | | |
| 2012/0242365 A1* | 9/2012 | Singh | ................ | G01R 31/42 324/762.01 |
| 2012/0286705 A1* | 11/2012 | Tanaka | ................ | H02P 27/08 318/139 |
| 2013/0222951 A1* | 8/2013 | Zhu | ................ | H02H 3/16 361/18 |

FOREIGN PATENT DOCUMENTS

| | | |
|---|---|---|
| EP | 2 228 895 A1 | 9/2010 |
| JP | 2004-187362 A | 7/2004 |
| WO | 2011/065278 A1 | 6/2011 |

OTHER PUBLICATIONS

International Search Report of PCT/AT2013/050118, mailed Sep. 23, 2013.
Austrian Office Action in A 50232/2012-1 dated May 17, 2013.

* cited by examiner

| Switching state | Relay state | V1 | V2 | V3 |
|---|---|---|---|---|
| S1 | close 21 and 19 | ≠ | ≠ | ≠ |
| S2 | close 20 | ≠ |  | ≠ |
| S3 | close 18, open 20 | ≠ | ≠ |  |
| S4 | close 20, open 21 | ≠ | ≠ |  |
| S5 | open 20, close 21 |  |  | = |
| S6 | open 21 |  |  | ≠ |
| S7 | close 21, open 19 |  | = | ≠ |
| S8 | close 19, close 20 |  | ≠ |  |
| S9 | open 19 |  |  |  |

Fig. 3

| Switching state | Relay state | V1 | V2 | V3 |
|---|---|---|---|---|
| S1_1 | close 19, 20, 21, open 18 | ≠ | ≠ | ≠ |
| S2_1 | close 18, open 20 | ≠ | ≠ | ≠ |
| S3_1 | close 20, open 19 | ≠ | ≠ | ≠ |
| S4_1 | close 19, open 21 | ≠ | ≠ | ≠ |
| S5_1 | close 21 | = | = | = |

Fig. 5

METHOD FOR CHECKING A SEPARATION POINT OF A PHOTOVOLTAIC INVERTER, AND PHOTOVOLTAIC INVERTER

CROSS REFERENCE TO RELATED APPLICATIONS

This application is the National Stage of PCT/AT2013/050118 filed on Jun. 11, 2013, which claims priority under 35 U.S.C. §119 of Austrian Application No. A 50232/2012 filed on Jun. 13, 2012, the disclosure of which is incorporated by reference. The international application under PCT article 21(2) was not published in English.

The invention relates to a method for checking a photovoltaic inverter separator between the photovoltaic inverter and a power supply network, comprising multiple phases and a neutral conductor, wherein multiple switching contacts of the separator are controlled by the photovoltaic inverter.

Furthermore, the invention relates to a photovoltaic inverter for converting a direct voltage to an alternating voltage with multiple phases and a neutral conductor, and for feeding the alternating voltage into a power supply network with multiple phases and a neutral conductor, with a separator of multiple relays with multiple switching contacts for galvanic separation to the phases and the neutral conductor of the power supply network.

Usually, an arrangement of one pair of relays per phase is used as a separator between the photovoltaic inverter and the power supply network so as to achieve a safe separation from the power supply network. For the admission of network-parallel feeding, the compliance with appropriate standards and provisions is a prerequisite. In the standard E DIN VDE 0128, for instance, a release point of two independent devices for network monitoring with assigned switches in series is compulsory.

Starting out from these requirements it may, additionally, also be necessary to also switch the neutral conductor via such a pair of relays in order to enable safe separation. Thus, in the case of such a separation switching eight independent relays are therefore necessary for a three-phase alternating current network. Furthermore, pursuant to appropriate standards it is necessary to check these relays regularly for their functionality. In this process the switching contacts of the relays are checked for actual opening and closing.

It is an object of the present invention to provide an above-mentioned method and a photovoltaic inverter by which the functionality of the separator can be checked quickly and in a simple manner without additional components being necessary. Moreover, the separator is intended to be as space-saving and cost-efficient as possible.

This object is solved with respect to the method in that the switching contacts of the separator are connected and checked in steps according to a switching pattern in that, in each step, each voltage is measured at at least one phase upstream and downstream of the separator in relation to the neutral conductor and the voltages are compared to each other, and the functionality of the switching contacts is derived therefrom. It is achieved in an advantageous manner that the functionality of every individual switching contact is checked—even in the case of two and multi-pole relays. The separator need not necessarily be integrated in the photovoltaic inverter, so that the installation size of the photovoltaic inverter need not be modified. For instance, one separator may be arranged in the photovoltaic inverter and a second separator may be arranged externally. Appropriate communication takes place between the separation points, so that the voltages may be transmitted. Correspondingly, the separation points are also cross-bonded.

Advantageously, each voltage is measured at each phase upstream and downstream of the separator in relation to the neutral conductor.

The voltages of the at least one corresponding phase are compared in relation to the neutral conductor as a function of the switching pattern.

The voltages required for voltage measurement may be supplied by the power supply network or by the photovoltaic inverter.

In accordance with one feature of the invention the voltages measured upstream and downstream of the separator are processed by two independent controllers which are connected with each other via a data bus.

The switching pattern is implemented by a stepwise change of the switching contacts of the separator from one switching state to another switching state, wherein the functionality of the individual switching contacts of the separator is derived in the individual switching states or the change of the switching states.

During every change of the switching state of the switching contacts of the separator in the form of opening or closing of the switching contacts the functionality of the switching contacts of the separator is derived.

The object according to the invention is also solved by an above-mentioned photovoltaic inverter, wherein the separator consists of four relays with at least one switching contact each, wherein every two switching contacts of two relays switchable independently of each other are connected in series for each connection of the phases and the neutral conductor.

For checking the functionality of the separator, devices for measuring the voltages of the phases in relation to the neutral conductor are provided upstream and downstream of the separator.

Advantageously, two independent controllers are provided for processing the voltages of the phases measured upstream and downstream of the separator in relation to the neutral conductor, said controllers being connected with one another via a data bus.

In accordance with one feature of the invention, one controller is connected with two relays at the input side of the separator for controlling the switching contacts of these relays and for processing the voltages measured upstream of the separator, and the second independent controller is connected with two relays at the output side of the separator for controlling the switching contacts of these relays and for processing the voltages measured downstream of the separator.

Advantageously, at least one phase upstream of the separator and at least one phase downstream of the separator are cross-bonded.

Figure 2:
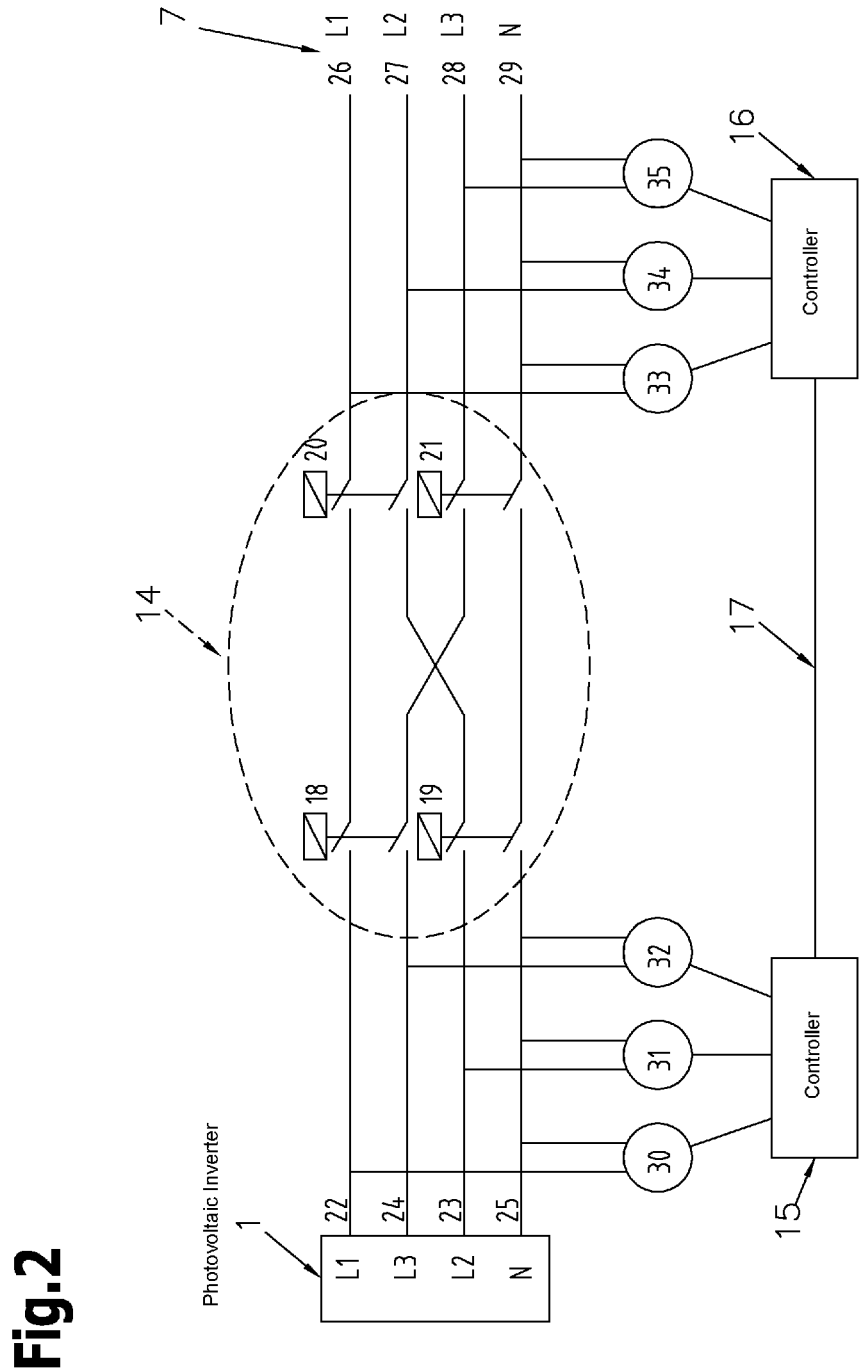
Figure 4:
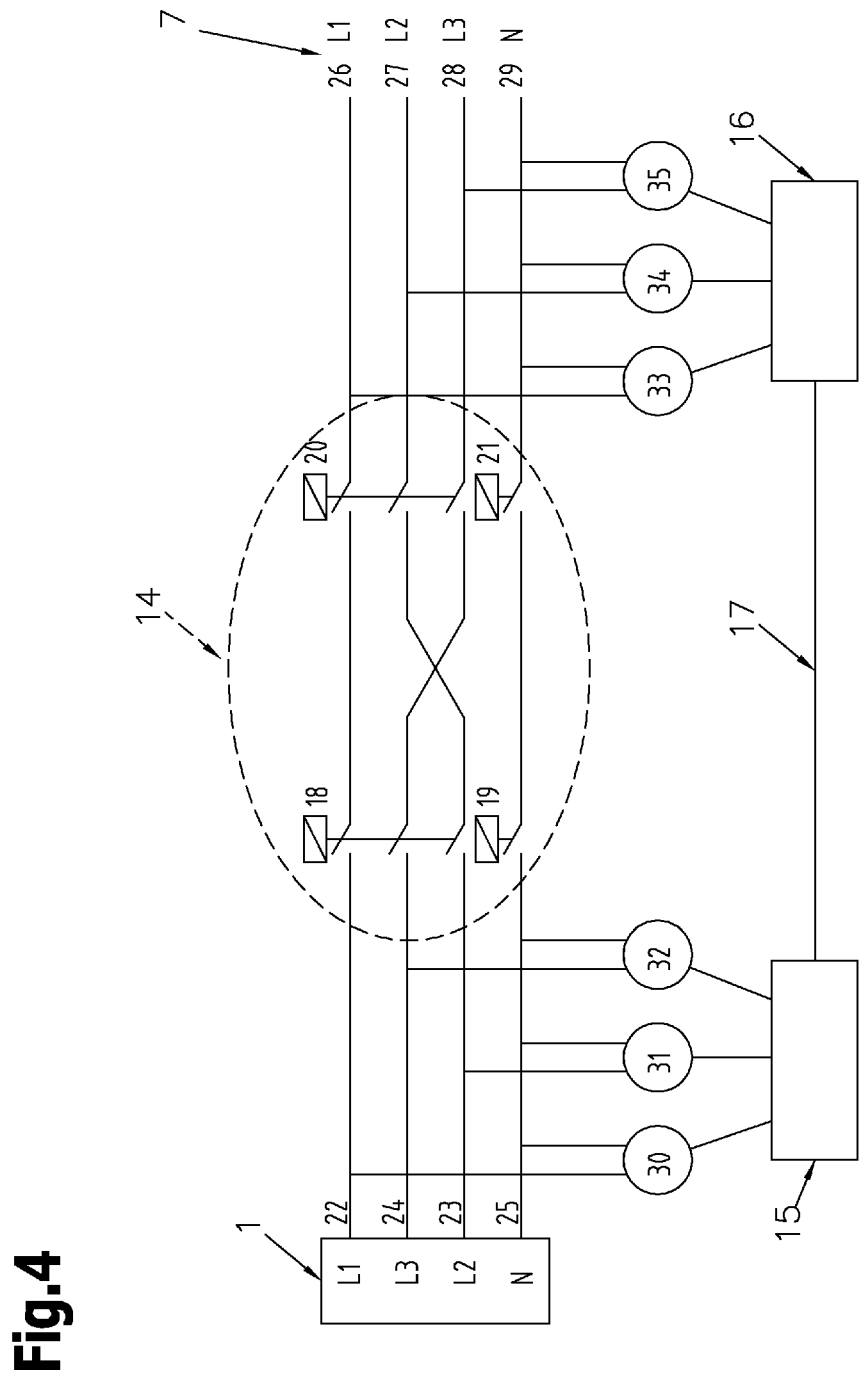

The present invention will be explained in detail by means of the enclosed schematic drawings. There show:

FIG. 1 a schematic overview illustration of an inverter of a photovoltaic system;

FIG. 2 the structure of a separator between a photovoltaic inverter and a power supply network with four two-pole relays as switches;

FIG. 3 a table with the switching pattern for checking the switching contacts of the separator pursuant to FIG. 2;

FIG. 4 an alternative structure of a separator between a photovoltaic inverter and a power supply network with two three-pole relays and two single-pole relays; and FIG. 5 a table with the switching pattern for checking the switching contacts of the separator pursuant to FIG. 4.

To begin with, it is noted that identical parts of the embodiment are provided with identical reference numbers.

FIG. 1 illustrates a structure of a known photovoltaic inverter 1, in detail of a HF inverter. Since the individual components and/or assembly groups and functions of photovoltaic inverters 1 have already been known from prior art, they will not be dealt with in detail in the following.

The photovoltaic inverter 1 comprises at least one input DC-DC-converter 2, an intermediate circuit 3, and an output DC-AC-converter 4. A power source 5 and/or a power generator preferably formed of one or multiple solar modules 6 connected in parallel and/or in series is connected to the input DC-DC-converter 2. The photovoltaic inverter 1 and the solar modules 6 are also referred to as photovoltaic system. The output of the photovoltaic inverter 1 and/or of the output DC-AC-converter 4 may be connected with a power supply network 7, such as a public or a private alternating voltage network or a multi-phase network, and/or with at least one electrical consumer 8 constituting a load. A consumer 8 is, for instance, formed by a motor, a refrigerator, a radio unit, etc. Likewise, the consumer 8 may also constitute a home supply. The individual components of the photovoltaic inverter 1, such as the input DC-DC-converter 2, etc., may be connected with a control device 10 via a data bus 9.

Preferably, such a photovoltaic inverter 1 serves as a so-called network-coupled photovoltaic inverter 1 whose power management has been optimized such that it feeds as much power into the power supply network 7 as possible. As is known from prior art, the consumers 8 are supplied via the supply network 7. It will be appreciated that a plurality of photovoltaic inverters 1 connected in parallel may also be used. Thus, it is possible to provide more power for operating the consumers 8. This power is supplied by the power source 5 in the form of a direct voltage which is connected with the photovoltaic inverter 1 via two connection lines 11, 12.

The control device 10 and/or the controller of the photovoltaic inverter 1 is, for instance, formed by a microprocessor, a micro controller or a computer. An appropriate control of the individual components of the photovoltaic inverter 1, such as the input DC-DC-converter 2 or the output DC-AC-converter 4, in particular the switching elements arranged therein, may be performed via the control device 10. For this purpose, the individual regulation and/or control sequences are stored by appropriate software programs and/or data and/or characteristics in the control device 10.

Furthermore, operating elements 13 by which it is, for instance, possible for the user to configure the photovoltaic inverter 1 and/or to indicate and adjust operating states or parameters (for example by means of light-emitting diodes), are connected with the control device 10. The operating elements 13 are, for instance, connected with the control device 10 via the data bus 9 or directly. Such operating elements 13 are, for example, arranged on a front of the photovoltaic inverter 1, so that operation from outside is possible. Likewise, the operating elements 13 may also be arranged directly on assembly groups and/or modules within the photovoltaic inverter 1.

When using a photovoltaic inverter 1 for feeding a power supply network 7 it is necessary pursuant to standard (for instance, pursuant to E DIN VDE 0128) to connect a separator 14 between the photovoltaic inverter 1 and the power supply network 7. This separator 14 has to be checked for orderly function before the photovoltaic inverter 1 is connected to the power supply network 7.

In accordance with the invention, the separator 14 between the photovoltaic inverter 1 and the power supply network 7 comprises four two-pole relays 18, 19, 20, and 21. Each of these relays 18-21 comprises a control inductor and two switching contacts switched therewith. The separator 14 according to the invention of these relays 18-21 pursuant to FIG. 2 yields, for each line between the photovoltaic inverter 1 and the supply network 7, a series connection of two switching contacts controllable independently of each other. The connection 22 of the phase L1 at the side of the photovoltaic inverter 1 is connected with the connection 26 of the phase L1 of the power supply network 7 by the first contacts of the relays 18 and 20. The connection 23 of the phase L2 at the side of the photovoltaic inverter 1 is connected with the connection 27 of the phase L2 of the supply network 7 by the first contact of the relays 19 and the second contact of the relays 20. The connection 24 of the phase L3 at the side of the photovoltaic inverter 1 is connected with the connection 28 of the phase L3 of the power supply network 7 via the second contact of the relays 18 and the first contact of the relays 21. Thus, the phases L2 and L3 are cross-bonded. The connection 25 of the neutral conductor at the side of the photovoltaic inverter 1 is connected with the connection 29 of the neutral conductor of the power supply network 7 by the second contact of the relays 19 and the second contact of the relays 21. Such a connection with cross-bonding of the phases L2 and L3 achieves that different voltages can be measured with the individual switching states of the relays 18-21 upstream and downstream of the separator 14 and an appropriate conclusion can be made with respect to the functionality of the separator 14.

Voltage measurement is, for instance, performed by means of a differential amplifier performing the measurement preparation for the measurement unit which may, for instance, be designed as a micro controller with an analog/digital converter performing the measurement of the voltages at the individual phases L1, L2, L3 in relation to the neutral conductor N.

By means of this switching arrangement it is possible to check the individual switching contacts of the separator 14 by measuring the voltages 30, 31 and 32 between the phases L1, L2 and L3 and the neutral conductor N upstream of the separator 14 and measuring the voltages 33, 34 and 35 between the phases L1, L2 and L3 and the neutral conductor N downstream of the separator 14 and comparing these voltages 30-35. The voltages are either supplied via the power supply network 7 or, in the case of an isolated inverter, by the photovoltaic inverter 1. The measurement voltage thus corresponds to the phase voltage. The measurements of the voltages 30, 31, 32 are performed upstream of the separator 14 at the respective connections 22, 23, 24 of the phases L1, L2, L3 in relation to the connection 25 of the neutral conductor N at the side of the photovoltaic inverter 1. The measurements of the voltages 33, 34, 35 are performed downstream of the separator 14 at the respective connections 26, 27, 28 of the phases L1, L2, L3 in relation to the connection 29 of the neutral conductor N at the side of the power supply network 7.

The voltages 30, 31, 32 and/or 33, 34, 35 measured upstream and downstream of the separator 14 are processed by two independent controllers 15 and 16 which are adapted to communicate via a data bus 17. The controllers 15, 16 also control every two of the four relays 18-21.

The method for checking the individual switching contacts of the relays 18-21 in accordance with the invention is, for instance, implemented by an appropriate software. In order to perform the checking of the individual switching contacts of the separator 14, the switching pattern illustrated in the table pursuant to FIG. 3 may, for instance, be used in combination with the evaluation table illustrated therein. If the associated measurement result pursuant to the evaluation table is fulfilled in the respective switching state, the functionality of the switching contacts of the separator 14 is given.

In the table pursuant to FIG. 3, all the switching states S1 to S9 are described which are passed through during checking. The change from one switching state to the next switching state is performed by stepwise switching of the relays 18-21, wherein the control for switching is performed by the controllers 15, 16. In each of the switching states S1 to S9 the voltages 30-32 at the connections 22-24 of the phases L1, L2, L3 in relation to the connection 25 of the neutral conductor N at the input of the separator 14 are now compared with the voltages 33-35 at the connections 26-28 of the phases L1, L2, L3 in relation to the connection 29 of the neutral conductor N at the output of the separator 14. This comparison is performed by the controllers 15, 16, wherein always the voltages of the same phase L1, L2, L3 are compared with each other. Correspondingly, a voltage value is always present on one side of the separator 14. On which side the voltage is present always depends on whether the voltage for measurement is supplied by the power supply network 7 or by the photovoltaic inverter 1. On the respectively other side of the separator 14 a voltage value is only measured if the corresponding relays 18-21 are switched. By means of this measurement method and/or checking method it is possible to detect whether all the switching contacts of the separator 14 can be closed and reopened. In addition to the switching states S1-S9 which are described below and which are relevant for the checking of the individual switching contacts of the relays 18-21, five further switching states occurring during the change of the switching states S1-S9 are necessary.

In the initial state of the method for checking the switching contacts in accordance with the invention all the switching contacts of the relays 18-21 are open. In this state no measurement takes place yet. In order to change to the first switching state S1, the relays 21 and 19 are closed. In the switching state S1 the voltage 30 of the phase L1 upstream of the separator 14 now has to be different from the voltage 33 of the phase L1, the voltage 31 of the phase L2 upstream of the separator 14 has to be different from the voltage 34 of the phase L2 downstream of the separator 14, and the voltage 32 of the phase L3 upstream of the separator 14 has to be different from the voltage 35 of the phase L3 downstream of the separator 14 since the connections between the individual phases L1, L2, L3 have to be interrupted upstream and downstream of the separator 14. If a comparison does not comply with the predetermined target state, this is an indication that a switching contact of a relay 18 or 20 is closed and/or stuck and could not be opened. The functionality of the separator 14 is hence not given.

In order to change to the next switching state S2, the relays 20 is closed, all the remaining relays 18, 19, 21 remain in the previous switching state. In this switching state it is checked whether the voltages 30 and 33 are different since the relays 18 has to be open. If this is not the case, the first switching contact of the relay 18 is defect. Furthermore, it has to be checked whether the voltages 32 and 35 are different. If this is not the case, the second switching contact of the relay 18 is defect. In addition it is checked whether the voltage 31 and 34 are identical. If this is not the case, the second switching contact of the relay 20 has not closed properly.

In order to change to the next switching state S3, the relay 18 is closed and the relay 20 is opened. In this state it is checked whether the voltages 30 and 33 are different, and whether the voltages 31 and 34 are different. Since the relay 20 opens the switching contacts between theses phases, this condition has to be fulfilled. If the difference in one of the two comparisons is not given, the first switching contact of the relay 20 sticks in the case of identity of the voltages 30 and 33 and the second switching contact of the relay 20 sticks in the case of identity of the voltages 31 and 34. The voltages 32 and 35 are identical in this state since the relays 18 and 21 are closed. Accordingly, the switching contacts are checked in one of the following switching states.

In order to change to the next switching state S4, the relay 20 is closed and the relay 21 is opened. In this state the voltage 30 has to be different from the voltage 33 and the voltage 31 has to be different from the voltage 34 for a correct function of the switching contacts of the separator 14. If one of the two conditions is not fulfilled, the second switching contact of the relay 21 sticks. This statement can be made since the voltage at the connection 29 and/or the connection 25 is switched to the second switching contact of the relay 21 and since it was already checked successfully in the previous switching states that the switching contacts of the relays 20 and 21 can at least be closed properly.

In order to change to the next switching state S5, the relay 20 is opened and the relay 21 is closed. In this switching state the voltages 32 and 35 have to be identical. If this is not the case, the first switching contact of the relay 21 could not be closed properly. The remaining voltages need not be compared in this switching state S5 since additional statements about the functionality of the switching contacts cannot be made thereby.

In order to change to the next switching state S6, the relay 21 is opened. In this switching state it is checked whether the voltages 32 and 35 are different. If these two voltages 32 and 35 are identical, a sticking first switching contact of the relay 21 can be concluded since on opening of this switching contact the voltages would have to be different. From the remaining voltage measurements no further relevant information may be obtained in this switching state S6.

In order to change to the next switching state S7, the relay 21 is closed and the relay 19 is opened. In this switching state it is checked whether the voltages 32 and 35 are different. If this is not the case, the second switching contact of the relay 19 sticks since for one of the two measurements (which one depends on the side of the separator 14 which is supplied with the voltage) the voltage at the connections 25 or 29 would have to be switched off by the second switching contact. The proper closing of the second switching contact of the relay 19 and of the second switching contact of the relay 21 was already checked by ensuring the identity of the voltages 32 and 35 in the switching state S5. The remaining voltages are not relevant for further checking in this switching state S5.

In order to change to the next switching state S8, the relays 19 and 20 are closed. In this switching state it is checked whether the voltages 31 and 34 are identical. If this is not the case, it can be concluded that the first switching contact of the relay 19 was not closed properly. This statement can be made since the second switching contact of the relay 21 was already checked in the switching state S4 and the second switching contact of the relay 20 was already checked in the switching state S3 and hence the first switching contact of the relay 19 has to stick in the case of non-fulfillment of the condition. The remaining voltages do not yield any further information in this switching state S8.

In order to change to the last switching state S9, the relay 19 is opened. In this switching state the voltage 31 has to be different from the voltage 34. If this is not the case, the first switching contact of the relay 19 sticks. This statement can be made since the proper function of the second switching contact of the relay 19 was already checked in the switching state S8 and the functionality of the first and second switching contacts of the relays 18, 20 and 21 was already checked in the previous switching states. The remaining voltages are not relevant for any further information in this switching state S9.

Thus, the relays 18 to 21 of the separator 14 are switched correspondingly with every switching state S1-S9, wherein the switching state of the previous switching state is maintained unless it is changed with the current switching state. Basically, the voltages 30-35 of all phases L1-L3 are measured in each switching state, wherein the voltages pursuant to the evaluation table have to concur for the checking of the functionality of the switching contacts.

In accordance with the invention, the separator 14 may also be implemented with two three-pole relays 18 and 20 and two single-pole relays 19 and 21, as is illustrated in FIG. 4. The checking of the separator 14 for sticking switching contacts is here also performed by comparing the voltages 30, 31, 32 and 33, 34, 35 measured upstream and downstream of the separator 14. For this purpose, a switching pattern whose states are illustrated in the table pursuant to FIG. 5 is also passed through in this switching variant.

The change from one switching state to the next one is performed by the stepwise switching of at least one of the relays 18-21, wherein the control for switching may be performed by the controllers 15, 16.

This variant of the checking method starts in the initial state S1_1. In this state the relays 19, 20 and 21 are closed and the relay 18 is opened. In this switching state the voltages 30 and 33 have to be different. If this is not the case, the first switching contact of the relay 18 sticks. Moreover, the voltages 31 and 34 have to be different. If this is not the case, the third switching contact of the relay 18 sticks. Furthermore, the voltages 32 and 35 have to be different. If this is not the case, the second switching contact of the relay 18 sticks. These statements can be made since the connection of all the connections 22-24 upstream of the separator with the connections 26-28 downstream of the separator 14 has to be interrupted via the relay 18. Thus, all switching contacts of the relay 18 are checked in this switching state S11.

In order to change to the next switching state S21, the relay 18 is closed and the relay 20 is opened. In this switching state the voltages 30 and 33 have to be different. If this is not the case, the first switching contact of the relay 20 sticks. Moreover, the voltages 31 and 34 have to be different. If this is not the case, the second switching contact of the relay 20 sticks. Furthermore, the voltages 32 and 35 have to be different. If this is not the case, the third switching contact of the relay 20 sticks. These statements can be made since the connections 22-24 upstream of the separator 14 have to be disconnected from the connections 26-28 downstream of the separator 24 via the relay 20.

In order to change to the next switching state S31, the relay 20 is closed and the relay 19 is opened. In this switching state the voltages 30 and 33 have to be different. If this is not the case, the first switching contact of the relay 19 sticks. Moreover, the voltages 31 and 34 and the voltages 32 and 35 have to be different. These statements can be made since the connection 25 upstream of the separator 14 has to be disconnected from the connection 29 downstream of the separator 14 by the relay 19. Thus, all voltages 30-32 at the input of the separator 14 have to be different from the voltages 33-35 at the output of the separator 14.

In order to change to the switching state S4_1, the relay 19 is closed and the relay 21 is opened. In this switching state the voltages 30 and 33 have to be different. If this is not the case, the first switching contact of the relay 21 sticks. Moreover, the voltages 31 and 34 and the voltages 32 and 35 have to be different. These statements can be made since the connection 25 upstream of the separator 14 and the connection 29 downstream of the separator 14 has to be interrupted by the relay 21. Thus, all voltages 30-32 at the input of the separator 14 have to be different from the voltages 33-35 at the output of the separator 14.

In order to change to the last switching state S5_1, the relay 21 is closed. In this switching state the voltage 30 and 33 have to be identical, the voltages 31 and 34 have to be identical, and the voltages 32 and 35 have to be identical. Since all relays 18-21 are closed in this switching state, all phases L1, L2, L3 and the neutral conductor N have to be connected through.

In equivalence to the first embodiment pursuant to FIG. 2, here, too, two phases L2 and L3 are cross-bonded.

The invention claimed is:

1. A method for checking a photovoltaic inverter separator between the photovoltaic inverter and a power supply network, comprising multiple phases and a neutral conductor,
   wherein multiple switching contacts of multiple relays of the separator are controlled by the photovoltaic inverter, and each voltage at each phase is measured upstream and downstream of the separator in relation to the neutral conductor,
   wherein in the separator at least one phase upstream of the separator and at least one phase downstream of the separator is cross-bonded,
   wherein the switching contacts of the separator are connected and checked in steps according to a switching pattern,
   wherein the switching pattern is implemented by a stepwise change of the switching contacts of the separator from one switching state to another switching state,
   wherein each switching state is assigned a measurement result in accordance with an evaluation table, and
   wherein the functionality of the switching contacts of the separator is derived in each switching state of the switching pattern in that, in each switching state, each voltage is measured at at least one phase upstream and downstream of the separator in relation to the neutral conductor, and the voltages are compared to the measurement results of the evaluation table.

2. The method according to claim 1, wherein the voltages are supplied by the power supply network.

3. The method according to claim 1, wherein the voltages are supplied by the photovoltaic inverter.

4. The method according to claim 1, wherein the voltages measured upstream and downstream of the separator are processed by two independent controllers, said controllers being connected with each other via a data bus.

5. A photovoltaic inverter for converting a direct voltage to an alternating voltage with multiple phases and a neutral conductor, and for feeding the alternating voltage to a power supply network with multiple phases and a neutral conductor, with a separator of multiple relays with multiple switching contacts for galvanic separation to the phases and the neutral conductor of the power supply network,
   wherein measuring devices are provided for measuring the voltages of the phases in relation to the neutral conductor upstream and downstream of the separator,
   wherein the separator comprises four relays with at least one switching contact each,
   wherein every two switching contacts of two relays that are switchable independently of each other are connected in series for each connection of the phases and of the neutral conductor,
   wherein in the separator at least one phase upstream of the separator and at least one phase downstream of the separator is cross-bonded,
   wherein two independent controllers are provided for processing the voltages of the phases measured upstream and downstream of the separator in relation to the neutral conductor, said controllers being connected with each other via a data bus, and
   wherein the controllers are designed for deriving the functionality of the switching contacts in each switching state by comparing the measured voltages with measurement values assigned in an evaluation table.

6. The photovoltaic inverter according to claim 5, wherein a controller is connected with two relays at the input side of the separator for controlling the switching contacts of these relays and for processing the voltages measured upstream of the separator, and
   wherein the second independent controller is connected with two relays at the output side of the separator for controlling the switching contacts of these relays and for processing the voltages measured downstream of the separator.

* * * * *